(12) United States Patent
Hsiao

(10) Patent No.: US 8,324,884 B2
(45) Date of Patent: Dec. 4, 2012

(54) APPARATUS AND METHOD FOR DC VOLTAGE MEASUREMENT

(75) Inventor: Li Shuo Hsiao, Chiayi (TW)

(73) Assignee: Silicon Motion, Inc., Jhubei (TW)

( * ) Notice: Subject to any disclaimer, the term of this patent is extended or adjusted under 35 U.S.C. 154(b) by 516 days.

(21) Appl. No.: 12/561,249

(22) Filed: Sep. 16, 2009

(65) Prior Publication Data

US 2010/0289481 A1 Nov. 18, 2010

(30) Foreign Application Priority Data

May 13, 2009 (TW) .............................. 98115794 A

(51) Int. Cl.
*G01R 19/18* (2006.01)
(52) U.S. Cl. ..................................... 324/120; 324/76.11
(58) Field of Classification Search .................. 324/120, 324/76.11
See application file for complete search history.

(56) References Cited

U.S. PATENT DOCUMENTS

| | | | |
|---|---|---|---|
| 5,012,242 A | | 4/1991 | Yoshio et al. |
| 6,282,111 B1* | | 8/2001 | Illingworth ..................... 363/98 |
| 2002/0075015 A1* | | 6/2002 | Morimoto et al. ............ 324/672 |
| 2005/0206760 A1* | | 9/2005 | Higashitsutsumi ........... 348/294 |
| 2008/0012574 A1* | | 1/2008 | Malherbe et al. ............. 324/606 |
| 2008/0315852 A1* | | 12/2008 | Jayaraman et al. ........... 323/285 |

FOREIGN PATENT DOCUMENTS

CN 101277111 A 10/2008

OTHER PUBLICATIONS

Office Action of corresponding CN patent application, issued Dec. 7, 2011.

* cited by examiner

*Primary Examiner* — Arleen M Vazquez
(74) *Attorney, Agent, or Firm* — Wang Law Firm, Inc.; Li K. Wang; Stephen Hsu

(57) ABSTRACT

The invention provides a method for DC voltage measurement. First, an input DC voltage is received. A temporary disturbance signal is then added to the input DC voltage to obtain a disturbed signal, wherein an amplitude of the temporary disturbance signal is greater than precision level of an analog-to-digital converter. The disturbed signal is then converted from analog to digital with the analog-to-digital converter to obtain a plurality of samples with different values. An average value is then derived from the samples. Finally, the average value is output as a measurement value of the input DC voltage.

20 Claims, 7 Drawing Sheets

APPARATUS AND METHOD FOR DC VOLTAGE MEASUREMENT

CROSS REFERENCE TO RELATED APPLICATIONS

This Application claims priority of Taiwan Patent Application No. 098115794, filed on May 13, 2009, the entirety of which is incorporated by reference herein.

BACKGROUND OF THE INVENTION

1. Field of the Invention

The invention relates to DC voltages, and more particularly to measurement of DC voltages.

2. Description of the Related Art

A portable electronic device generally uses a battery power supply. Batteries provide the portable electronic device with DC voltages. The DC voltage level provided by batteries reduces with time. When the DC voltage reduces to a threshold level, the portable electronic device cannot obtain enough power for normal operation, thereby making the portable electronic device nonoperational. To maintain normal operation of portable electronic devices, the portable electronic devices are generally equipped with a DC voltage meter for monitoring the DC voltage level supplied by batteries. Thus, when the DC voltage level reduces to a threshold level, a user of the portable electronic device will be alerted to the low threshold level by the DC voltage meter and can thus change the batteries of the portable electronic device.

A majority of portable electronic devices are digital devices. A DC voltage meter measuring a DC voltage for a digital portable device therefore converts a measurement value of the DC voltage to a digital value with an analog-to-digital converter, and then outputs the digital value to the digital portable device. When the digital portable device receives the digital value from the DC voltage meter, the digital portable device can then convert the digital value to a picture and show the picture on a screen of the digital portable device to indicate the DC voltage level of a battery. The analog-to-digital converter, however, is limited to precision level thereof and often, the digital value converted from the measurement value cannot accurately reflect the DC voltage level of the battery. For example, a 5-bit analog-to-digital converter has 32 ($=2^5$) output values. When the 5-bit analog-to-digital converter has an input voltage range of 0V~3V, the precision level of the analog-to-digital converter is therefore 0.09V ($=3V/32$). Thus, voltage variation with a level less than the precision level of the analog-to-digital converter cannot be detected by the analog-to-digital converter.

Referring to FIG. 1, a schematic diagram of a conventional method for DC voltage measurement is shown. Assume that an analog-to-digital converter of a DC voltage meter has five output values of 0, 1, 2, 3, and 4. The output values respectively correspond to voltage ranges of −0.5V~0.5V, 0.5V~1.5V, 1.5V~2.5V, 2.5V~3.5V, 3.5V~4.5V. When an input DC voltage is 2.8V which falls within the voltage range of 2.5V~3.5V, the analog-to-digital converter converts the input DC voltage to a digital output value of 3. Even if the DC voltage meter continues to measure the input DC voltage at time t1, t2, t3, t4, and t5, the analog-to-digital converter only outputs 5 output values of 3. The user therefore only obtains an approximate measurement voltage of 3V, and cannot obtain a precise measurement voltage of 2.8V. The approximate measurement voltage may lead to inaccurate determination of the battery voltage level, and the user may not be notified in time to change batteries of their portable electronic device. A method for precisely measuring a DC voltage is therefore required.

BRIEF SUMMARY OF THE INVENTION

The invention provides a method for DC voltage measurement. First, an input DC voltage is received. A temporary disturbance signal is then added to the input DC voltage to obtain a disturbed signal, wherein an amplitude of the temporary disturbance signal is greater than precision level of an analog-to-digital converter. The disturbed signal is then converted from analog to digital with the analog-to-digital converter to obtain a plurality of samples with different values. An average value is then derived from the samples. Finally, the average value is output as a measurement value of the input DC voltage.

The invention also provides an apparatus for DC voltage measurement. In one embodiment, the apparatus comprises a disturbance circuit, an analog-to-digital converter, and a controller. The disturbance circuit receives an input DC voltage and adds a temporary disturbance signal to the input DC voltage to obtain a disturbed signal. The analog-to-digital converter then converts the disturbed signal from analog to digital to obtain a plurality of samples with different values. The controller then derives an average value from the samples and outputs the average value as a measurement value of the input DC voltage. Amplitude of the temporary disturbance signal is greater than a precision level of the analog-to-digital converter.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
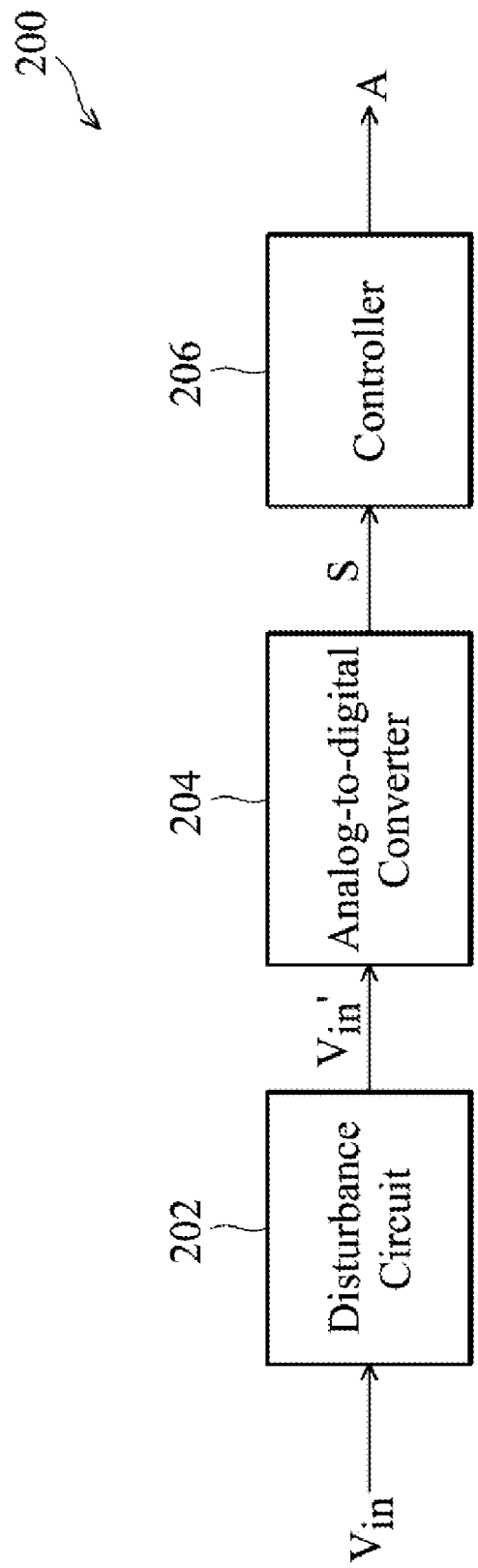
FIG. 2 is a block diagram of an apparatus for DC voltage measurement according to the invention.
Figure 3:
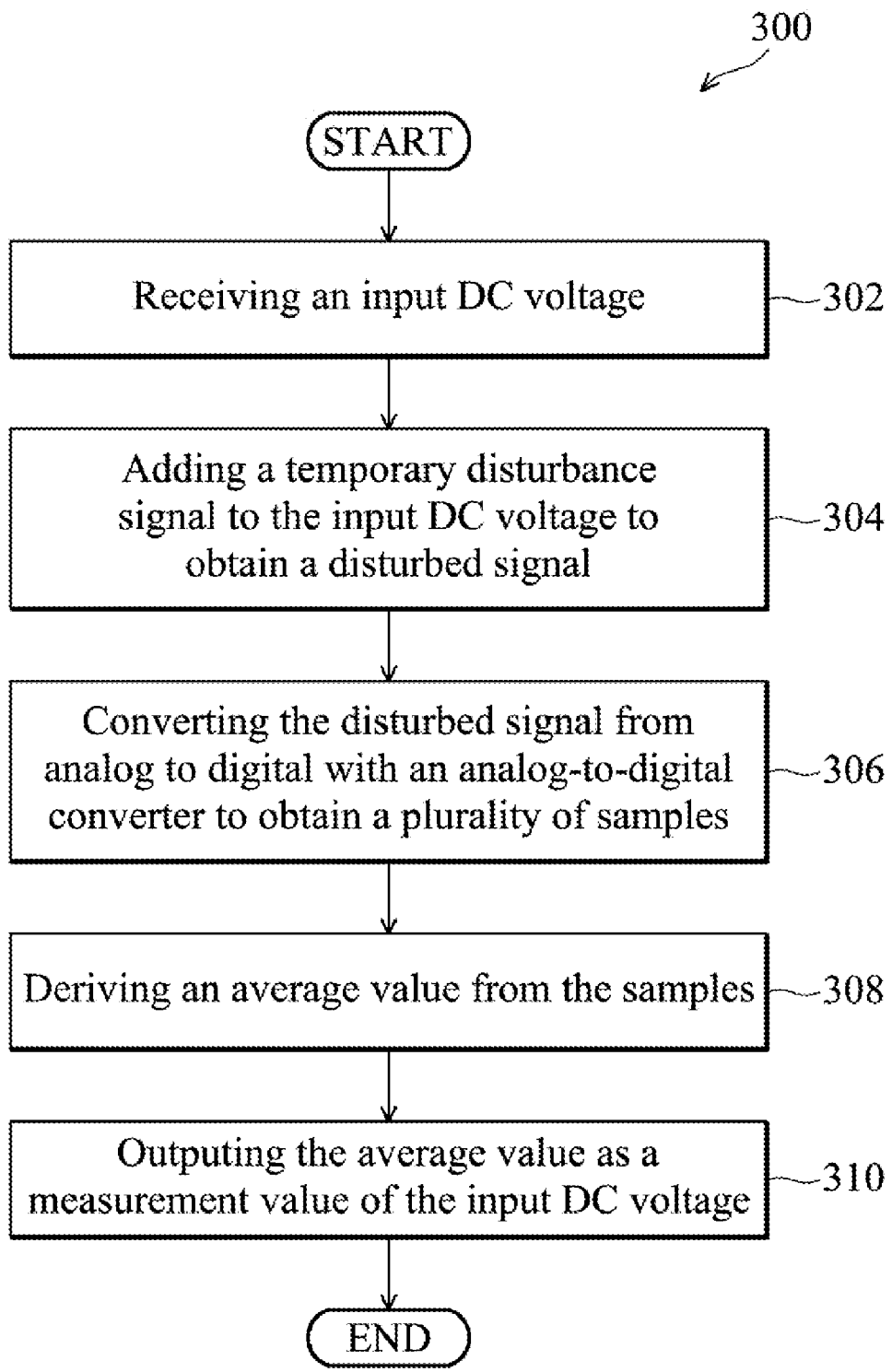
FIG. 3 is a flowchart of a method for DC voltage measurement according to the invention.

Referring to FIG. 2, a block diagram of an apparatus 200 for DC voltage measurement according to the invention is shown. The apparatus 200 receives an input DC voltage $V_{in}$, and converts the input DC voltage $V_{in}$ to a digital output value A. In one embodiment, the apparatus 200 comprises a disturbance circuit 202, an analog-to-digital converter 204, and a controller 206. Referring to FIG. 3, a flowchart of a method 300 for DC voltage measurement according to the invention is shown. The apparatus 300 converts the input DC voltage $V_{in}$ to the digital output value A according to the method 300, wherein the digital output value A has a precision level higher than that of the analog-to-digital converter 204. Because a conventional DC voltage meter is limited to a precision level of an analog-to-digital converter, and the apparatus 200 may generate a digital output value A with a precision level higher than that of the analog-to-digital converter 204, the apparatus 200 has a higher performance than that of the conventional DC voltage meter.

The disturbance circuit 202 first receives an input DC voltage $V_{in}$ (step 302). The disturbance circuit 202 then adds a temporary disturbance signal to the input DC voltage $V_{in}$ to obtain a disturbed signal $V_{in}'$ (step 304). The temporary disturbance signal has a voltage disturbance lasting for a short period, and the voltage disturbance of the temporary disturbance signal is greater than the precision level of the analog-to-digital converter 204. After the disturbance circuit 202 adds the temporary disturbance signal to the input DC voltage $V_{in}$, the disturbed signal $V_{in}'$ has a temporary voltage shift around the level of the input DC voltage $V_{in}$. The disturbed signal $V_{in}'$ generated by the disturbance circuit 202 is then delivered to the analog-to-digital converter 204. The analog-to-digital converter 204 then converts the disturbed signal $V_{in}'$ from analog to digital to obtain a plurality of samples S respectively corresponding to different sampling times (step 306). Because the disturbed signal $V_{in}'$ has a temporary voltage shift around the level of the input DC voltage $V_{in}$, the samples S generated by the analog-to-digital converter 204 have different values.

The samples S generated by the analog-to-digital converter 204 are then delivered to the controller 206. The controller 206 then derives an average value A from the samples S (step 308). In one embodiment, the controller 206 selects a plurality of samples from the samples S, and then averages the selected samples to obtain the average value A. In another embodiment, the controller 206 selects a plurality of samples from the samples S, and then averages the selected samples according to a plurality of weights respectively corresponding to the selected samples to obtain the average value A. Because the disturbance voltage $V_{in}'$ gradually approaches the input DC value $V_{in}$, the weights corresponding to the selected samples increase with the time for sampling the selected samples.

Because the selected samples have different values which are all around the level of the input DC value $V_{in}$, the average value A is taken as an approximate value of the input DC value $V_{in}$. In addition, because the average value A is a weighted average of the selected samples, the precision level of the average value A is higher than those of the selected samples. Moreover, if the disturbed signal $V_{in}'$ does not drift with a center level of the input DC value $V_{in}$, the controller 206 must add a compensating value to the average value A after the average value A is obtained. Finally, the controller 206 outputs the average value A as a measurement value of the input DC voltage $V_{in}$ (step 310).

Figure 4:
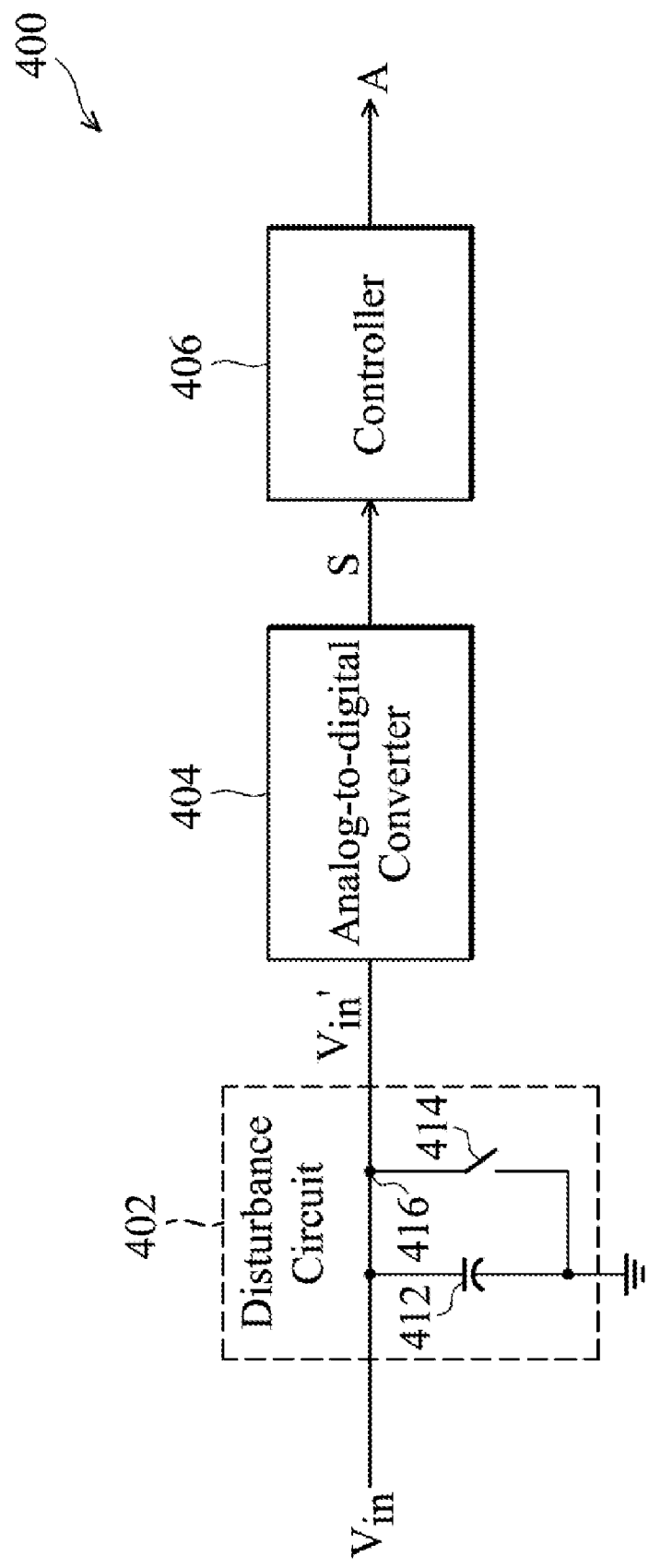
FIG. 4 is a block diagram of an embodiment of an apparatus for DC voltage measurement according to the invention.

Referring to FIG. 4, a block diagram of an embodiment of an apparatus 400 for DC voltage measurement according to the invention is shown. In one embodiment, the apparatus 400 comprises a disturbance circuit 402, an analog-to-digital converter 404, and a controller 406. The disturbance circuit 402 first pulls the voltage of the disturbed signal $V_{in}'$ down to a ground voltage, and then gradually charges the disturbed signal $V_{in}'$ from the ground voltage to the level of the input DC voltage $V_{in}$. In one embodiment, the disturbance circuit 402 comprises a capacitor 412 and a switch circuit 414. In one embodiment, the disturbance circuit 402 has an output node 416 for outputting the disturbed signal $V_{in}'$ to the analog-to-digital converter 404. The capacitor 412 is coupled between the output node 416 and the ground voltage. Similarly, the switch circuit 414 is also coupled between the output node 416 and the ground voltage. The output node 416 is further coupled to the node for receiving the input DC voltage $V_{in}$.

Figure 5:
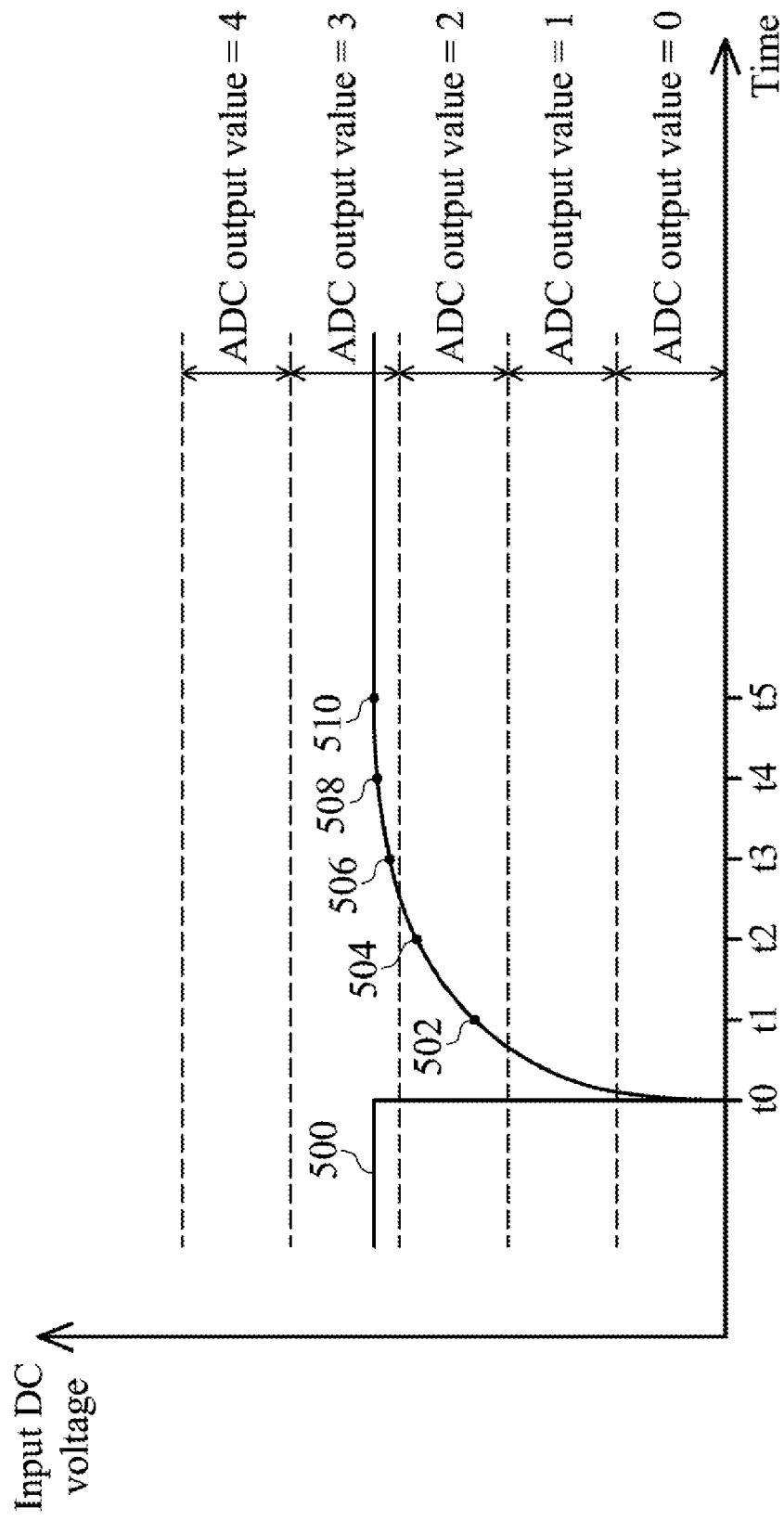
FIG. 5 is a schematic diagram of a disturbed signal generated by a disturbance circuit in FIG. 4.

Referring to FIG. 5, a schematic diagram of a disturbed signal $V_{in}'$ generated by a disturbance circuit 402 in FIG. 4 is shown. The disturbed signal $V_{in}'$ is indicated by a curve 500 in FIG. 5. Prior to time t0, the switch circuit 414 is switched off to decouple the output node 416 from the ground voltage. The disturbed signal $V_{in}'$ prior to time t0 therefore has a voltage level equal to the input DC voltage $V_{in}$. The switch circuit 414 is switched on to couple the output node 416 to the ground voltage at time t0, and the voltage level of the disturbed signal $V_{in}'$ is therefore lowered down to the ground voltage at time t0. The switch circuit 414 of the disturbed circuit 402 is then switched off again to decouple the output node 416 from the ground voltage. Because the output node 416 is coupled to the input DC voltage $V_{in}$, the disturbed signal $V_{in}'$ is then gradually raised to approach the level of the input DC voltage $V_{in}$.

The disturbed signal $V_{in}'$ is then delivered to the analog-to-digital converter 404. Assume that the analog-to-digital converter 404 samples the disturbed signal $V_{in}'$ at time t1, t2, t3, t4, and t5 to obtain samples 502, 504, 506, 508, and 510. Assume that the analog-to-digital converter 404 has five output values respectively corresponding to voltage ranges of −0.5V~0.5V, 0.5V~1.5V, 1.5V~2.5V, 2.5V~3.5V, and 3.5V~4.5V. The voltages of the samples 502 and 504 fall in the voltage range of 1.5V~2.5V, and the analog-to-digital converter 404 therefore converts the samples 502 and 504 to digital output values of 2. The voltages of the samples 506, 508, and 510 fall in the voltage range of 2.5V~3.5V, and the analog-to-digital converter 404 therefore converts the samples 506, 508, and 510 to digital output values of 3.

Figure 1:
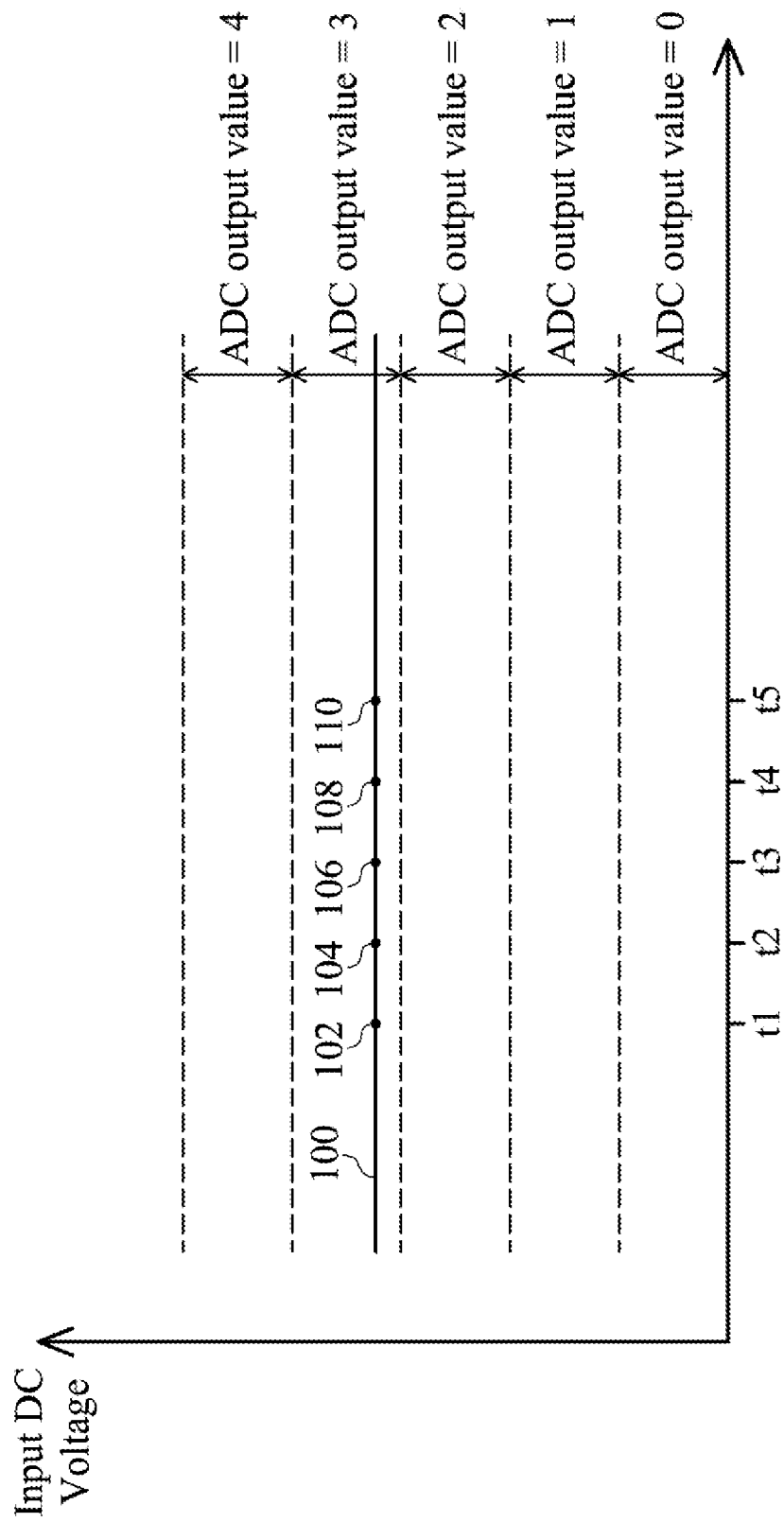
FIG. 1 is a schematic diagram of a conventional method for DC voltage measurement.

The controller 406 then averages digital output values 2, 2, 3, 3, and 3 corresponding to the samples 502, 504, 506, 508, and 510 to obtain an average value of 2.6. Because the disturbance circuit 402 obtains the disturbed signal $V_{in}'$ by lowering the input DC voltage $V_{in}$, the average value is therefore lower than a true level of the input DC voltage $V_{in}$, and the controller 406 therefore adds a compensating value 0.2 to the average value 2.6 to obtain a measurement value 2.8 as a final output of the apparatus 400. The measurement value 2.8 is therefore equal to the input DC voltage $V_{in}$. In comparison with the conventional DC voltage measurement method shown in FIG. 1, the measurement value 2.8V obtained by the apparatus 400 according to the invention is more precise than the measurement value 3V obtained by the conventional DC voltage measurement method.

Figure 6:
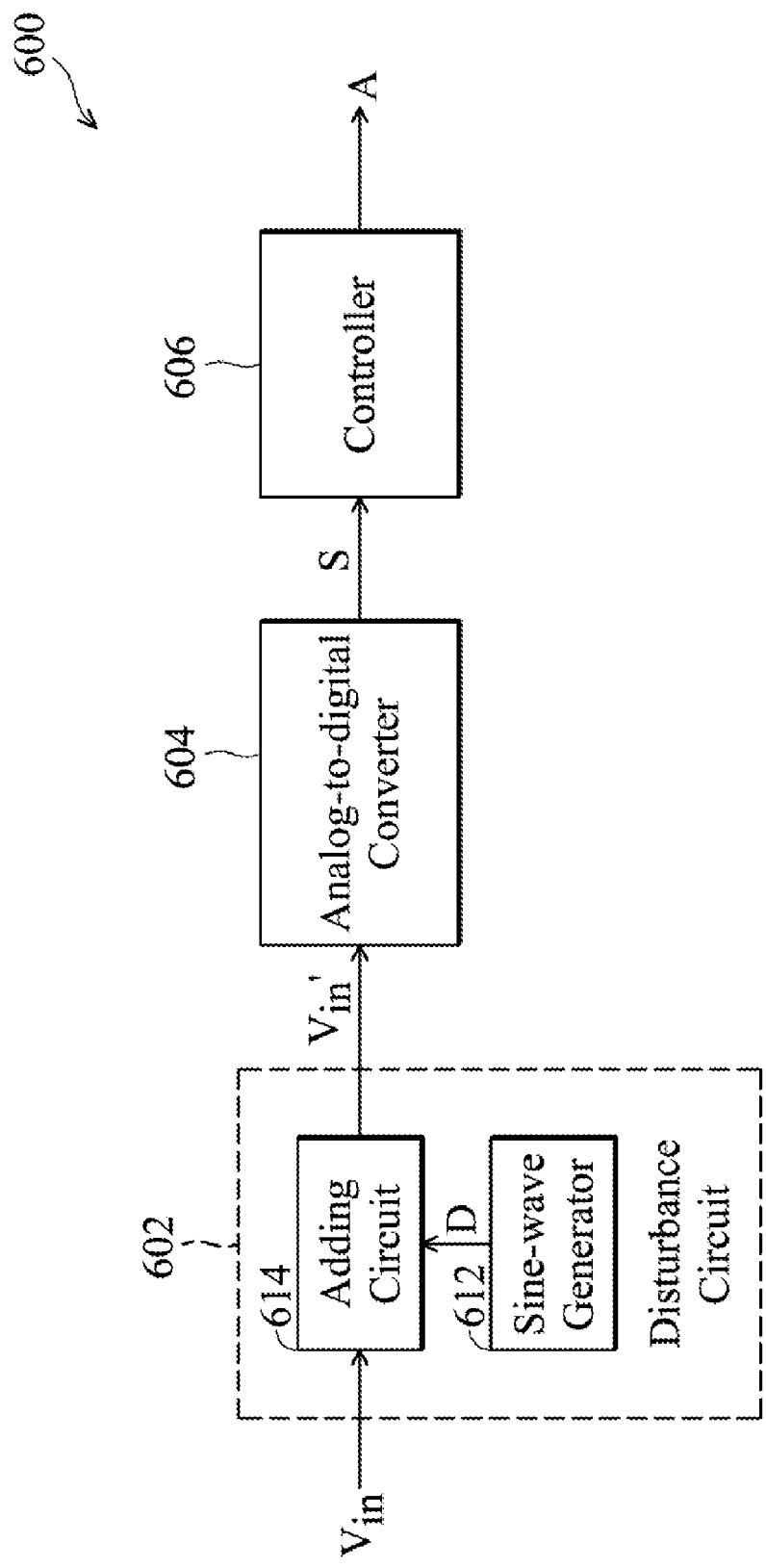
FIG. 6 is a block diagram of another embodiment of an apparatus for DC voltage measurement according to the invention.

Referring to FIG. 6, a block diagram of another embodiment of an apparatus 600 for DC voltage measurement according to the invention is shown. In one embodiment, the apparatus 600 comprises a disturbance circuit 602, an analog-to-digital converter 604, and a controller 606. In one embodiment, the disturbance circuit 602 comprises a sine-wave generator 612 and an adding circuit 614. The sine-wave generator 612 first generates a sine wave D as the temporary disturbance signal. In one embodiment, the amplitude of the sine wave D is greater than half of the precision level of the analog-to-digital converter 604. The adding circuit 614 then adds the sine wave D to the input DC voltage $V_{in}$ to obtain the disturbed signal $V_{in}'$. The disturbed signal $V_{in}'$ therefore oscillates with a center level of the input DC voltage $V_{in}$. The analog-to-digital converter 604 can then sample the disturbed signal $V_{in}'$ to obtain a plurality of samples S, wherein the samples S have different values similar to that of the input DC voltage $V_{in}$. The controller 606 can then derive an average value A with a high precision level from the samples S, and then output the average value A as a measurement value of the input DC voltage $V_{in}$.

Figure 7:
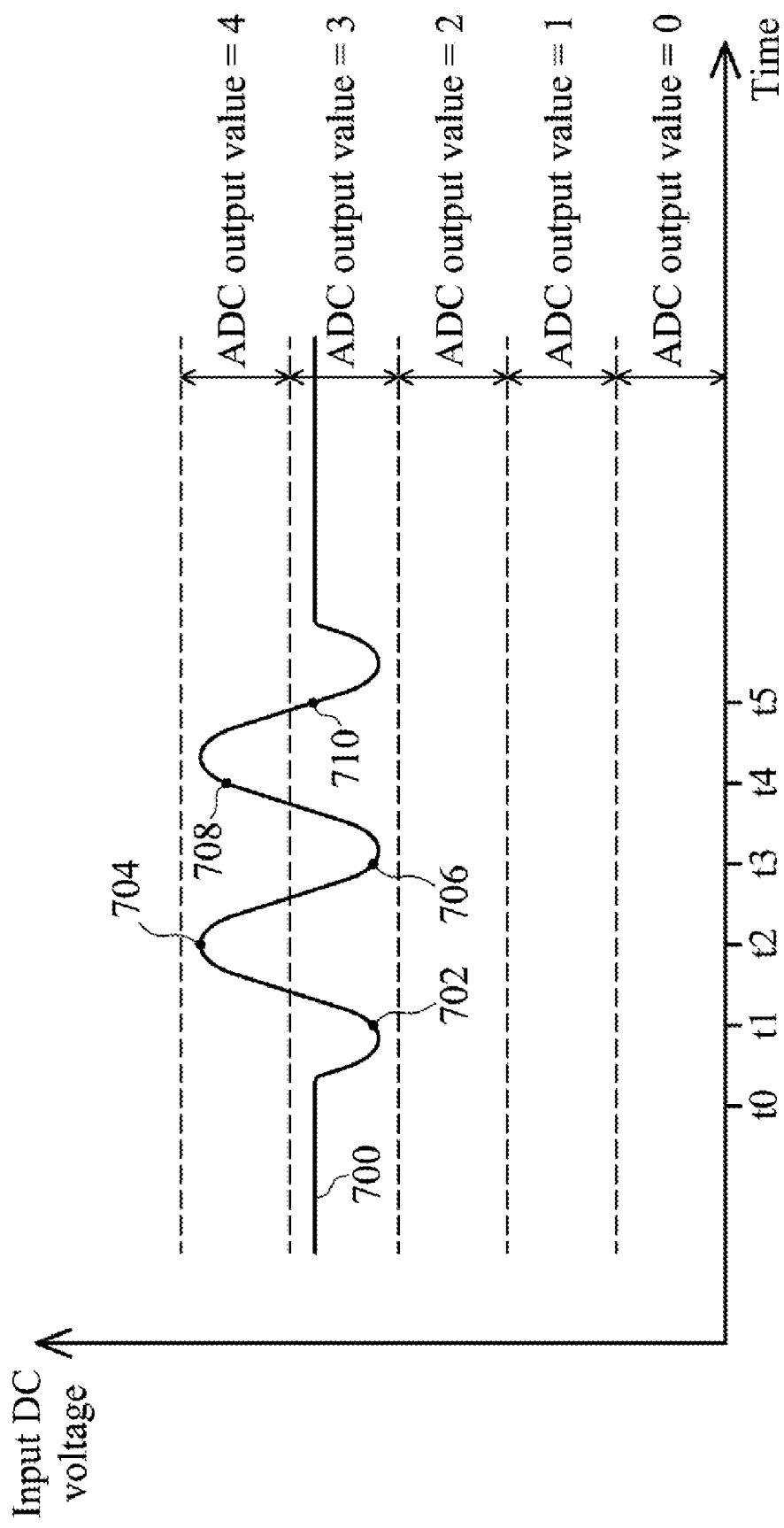
FIG. 7 is a schematic diagram of a disturbed signal generated by a disturbance circuit in FIG. 6.

Referring to FIG. 7, a schematic diagram of a disturbed signal generated by a disturbance circuit 602 in FIG. 6 is shown. The disturbed signal $V_{in}'$ is indicated by a curve 700 in FIG. 7. Prior to time t0, the sine-wave generator 612 has not generated a sine wave D. The disturbed signal $V_{in}'$ prior to time t0 therefore has a voltage level equal to the input DC voltage $V_{in}$. The sine-wave generator 612 then starts to generate a sine wave D at time t0, and the voltage level of the disturbed signal $V_{in}'$ therefore starts to oscillate with a center level of the input DC voltage $V_{in}$ at time t0. The disturbed signal $V_{in}'$ is then delivered to the analog-to-digital converter 604. Assume that the analog-to-digital converter 604 samples the disturbed signal $V_{in}'$ at time t1, t2, t3, t4, and t5 to obtain samples 702, 704, 706, 708, and 710.

Assume that the analog-to-digital converter 604 has five output values respectively corresponding to voltage ranges of −0.5V~0.5V, 0.5V~1.5V, 1.5V~2.5V, 2.5V~3.5V, and 3.5V~4.5V. The voltages of the samples 702, 706, and 710 fall in the voltage range of 2.5V~3.5V, and the analog-to-digital converter 604 therefore converts the samples 702, 704, and 710 to digital output values of 3. The voltages of the samples 704 and 708 fall in the voltage range of 3.5V~4.5V, and the analog-to-digital converter 604 therefore converts the samples 704 and 708 to digital output values of 4. The controller 606 then averages digital output values 3, 4, 3, 4, and 3 corresponding to the samples 702, 704, 706, 708, and 710 to obtain an average value of 3.4 as a measurement value. The measurement value 3.4 is therefore approximate to the input DC voltage $V_{in}$ of 3.3V. In comparison with the conventional DC voltage measurement method shown in FIG. 1, the measurement value 3.4V obtained by the apparatus 400 according to the invention is more precise than the measurement value 3V obtained by the conventional DC voltage measurement method.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for DC voltage measurement, comprising:
   receiving an input DC voltage;
   adding a temporary disturbance signal to the input DC voltage to obtain a disturbed signal, wherein an amplitude of the temporary disturbance signal is greater than precision level of an analog-to-digital converter;
   converting the disturbed signal from analog to digital with the analog-to-digital converter to obtain a plurality of samples with different values;
   deriving an average value from the samples; and
   outputting the average value as a measurement value of the input DC voltage.

2. The method as claimed in claim 1, wherein adding of the temporary disturbance signal comprises:
   lowering the voltage of the disturbed signal to a ground voltage; and
   gradually charging the disturbed signal from the ground voltage to the input DC voltage.

3. The method as claimed in claim 2, wherein adding of the temporary disturbance signal comprises:
   coupling an output node of the disturbed signal to the input DC voltage;
   coupling a capacitor between the output node and the ground voltage; and
   coupling a switch circuit between the output node and the ground voltage,
   wherein lowering of the voltage of the disturbed signal comprises:
      switching on the switch circuit to couple the output node to the ground voltage;
      charging of the disturbed signal comprises: and
      switching off the switch circuit to decouple the output node from the ground voltage.

4. The method as claimed in claim 1, wherein the temporary disturbance signal is a sine wave, and the amplitude of the sine wave is greater than half of the precision level of the analog-to-digital converter.

5. The method as claimed in claim 1, wherein adding of the temporary disturbance signal comprises:
   generating a sine wave as the temporary disturbance signal with a sine wave generator, wherein the amplitude of the sine wave is greater than half of the precision level of the analog-to-digital converter; and
   adding the sine wave to the input DC voltage to obtain the disturbed signal.

6. The method as claimed in claim 1, wherein deriving of the average value comprises:
   selecting a plurality of first samples from the samples; and
   averaging the first samples to obtain the average value.

7. The method as claimed in claim 1, wherein deriving of the average value comprises:
   selecting a plurality of first samples from the samples;
   averaging the first samples to obtain an average sample value; and
   adding a compensation value to the average sample value to obtain the average value.

8. The method as claimed in claim 1, wherein deriving of the average value comprises:
   selecting a plurality of first samples from the samples; and
   averaging the first samples according to a plurality of weights respectively corresponding to the first samples to obtain the average value.

9. The method as claimed in claim 8, wherein the voltage of the disturbed signal gradually approaches the input DC value, and the weights corresponding to the samples increase with the time for sampling the first samples.

10. The method as claimed in claim 1, wherein the input DC voltage is a battery voltage.

11. An apparatus for DC voltage measurement, comprising:
    a disturbance circuit, receiving an input DC voltage, and adding a temporary disturbance signal to the input DC voltage to obtain a disturbed signal;
    an analog-to-digital converter, converting the disturbed signal from analog to digital to obtain a plurality of samples with different values; and
    a controller, deriving an average value from the samples, and outputting the average value as a measurement value of the input DC voltage,
    wherein an amplitude of the temporary disturbance signal is greater than precision level of the analog-to-digital converter.

12. The apparatus as claimed in claim 11, wherein the disturbance circuit lowers the voltage of the disturbed signal to a ground voltage, and then gradually charges the disturbed signal from the ground voltage to the input DC voltage, thereby adding the temporary disturbance signal to the input DC voltage.

13. The apparatus as claimed in claim 12, wherein the disturbance circuit comprises:
- a capacitor, coupled between an output node of the disturbed signal and the ground voltage, wherein the output node is further coupled to the input DC voltage; and
- a switch circuit, coupled between the output node and the ground voltage, switched on to couple the output node to the ground voltage to lower the voltage of the disturbed signal to the ground voltage, and switched off to decouple the output node from the ground voltage to charge the disturbed signal to the input DC voltage.

14. The apparatus as claimed in claim 11, wherein the temporary disturbance signal is a sine wave, and the amplitude of the sine wave is greater than half of the precision level of the analog-to-digital converter.

15. The apparatus as claimed in claim 11, wherein the disturbance circuit comprises:
- a sine-wave generator, generating a sine wave as the temporary disturbance signal, wherein the amplitude of the sine wave is greater than half of the precision level of the analog-to-digital converter; and
- an adding circuit, adding the sine wave to the input DC voltage to obtain the disturbed signal.

16. The apparatus as claimed in claim 11, wherein the controller selects a plurality of first samples from the samples, and averages the first samples to obtain the average value.

17. The apparatus as claimed in claim 11, wherein the controller selects a plurality of first samples from the samples, averages the first samples to obtain an average sample value, and adds a compensation value to the average sample value to obtain the average value.

18. The apparatus as claimed in claim 11, wherein the controller selects a plurality of first samples from the samples, and averages the first samples according to a plurality of weights respectively corresponding to the first samples to obtain the average value.

19. The apparatus as claimed in claim 18, wherein the voltage of the disturbed signal gradually approaches the input DC value, and the weights corresponding to the samples increase with the time for sampling the first samples.

20. The apparatus as claimed in claim 1, wherein the input DC voltage is a battery voltage.

\* \* \* \* \*